United States Patent
Kumamoto et al.

(10) Patent No.: US 7,710,304 B2
(45) Date of Patent: May 4, 2010

(54) A/D CONVERTER AND SEMICONDUCTOR DEVICE

(75) Inventors: Toshio Kumamoto, Tokyo (JP); Takashi Okuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/178,244

(22) Filed: Jul. 23, 2008

(65) Prior Publication Data

US 2009/0027247 A1    Jan. 29, 2009

(30) Foreign Application Priority Data

Jul. 25, 2007    (JP) .............................. 2007-193085

(51) Int. Cl.
*H03M 1/12*    (2006.01)

(52) U.S. Cl. ...................... 341/155; 341/143

(58) Field of Classification Search ................. 341/143, 341/172, 155; 333/173
See application file for complete search history.

(56) References Cited

U.S. PATENT DOCUMENTS

| | | | | |
|---|---|---|---|---|
| 5,177,484 A | * | 1/1993 | Bruckmann | .................. 341/172 |
| 6,369,745 B1 | * | 4/2002 | Lee et al. | ..................... 341/166 |
| 7,345,615 B2 | * | 3/2008 | Kawahito | .................... 341/162 |

OTHER PUBLICATIONS

Jung, Walter G., "OP AMP Applications," Applied Technology of Signal Processing by OP Amplifier, All About OP Amplifier, vol. 2, Analog Devices, CQ Publishing, Feb. 1, 2005, p. 115.

* cited by examiner

*Primary Examiner*—Brian Young
(74) *Attorney, Agent, or Firm*—McDermott Will & Emery LLP

(57) ABSTRACT

In an A/D converter including a switched capacitor integration circuit, to suppress an effect of a noise generated in the switched capacitor circuit while suppressing increase in a forming area of the circuit. A first-stage integrator of a differential input type A/D converter includes first and second switched capacitor circuits, and includes a noise cancel circuit for generating a noise cancel signal to cancel a kickback noise generated due to switching operation thereof.

14 Claims, 12 Drawing Sheets

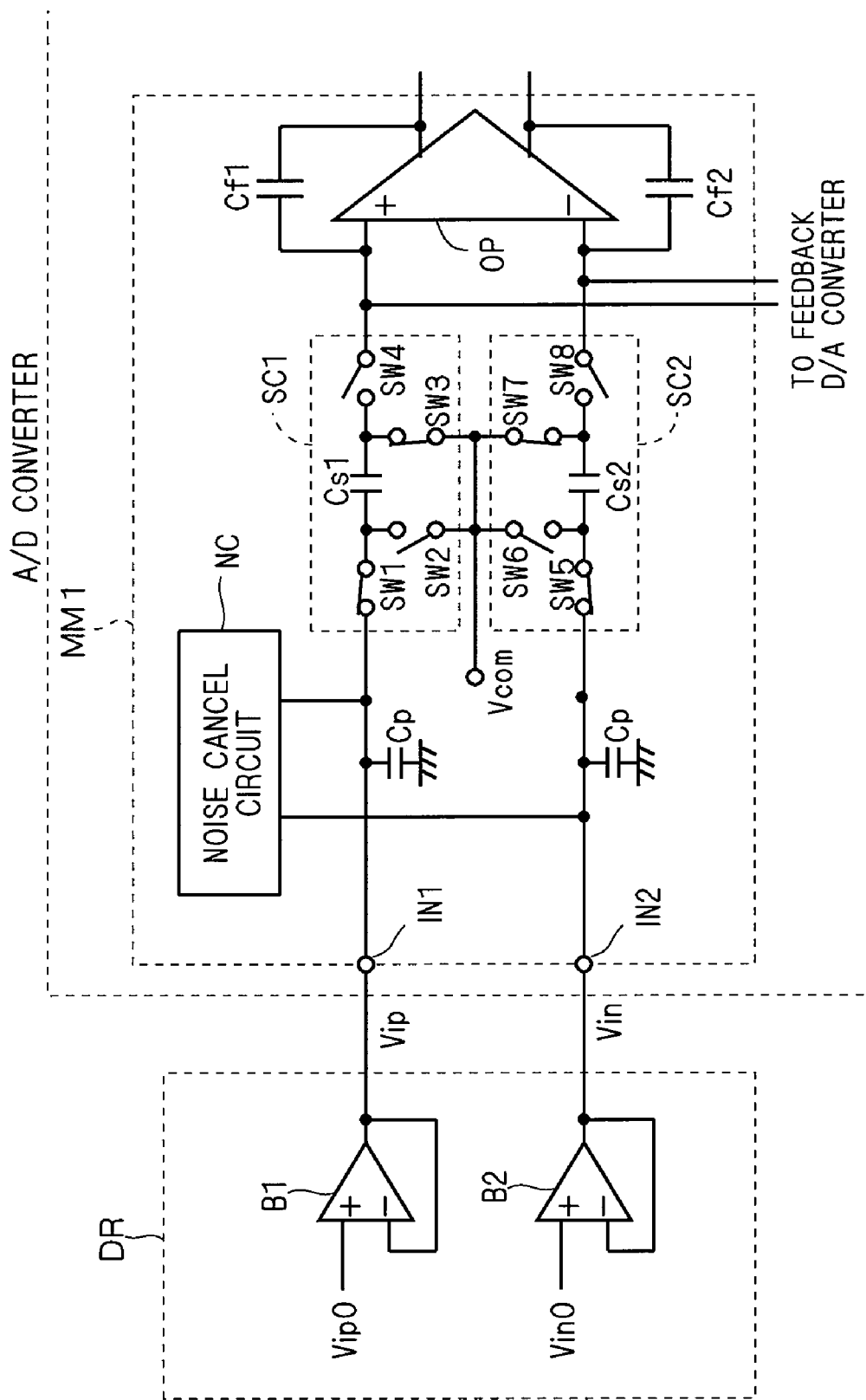
F I G . 3

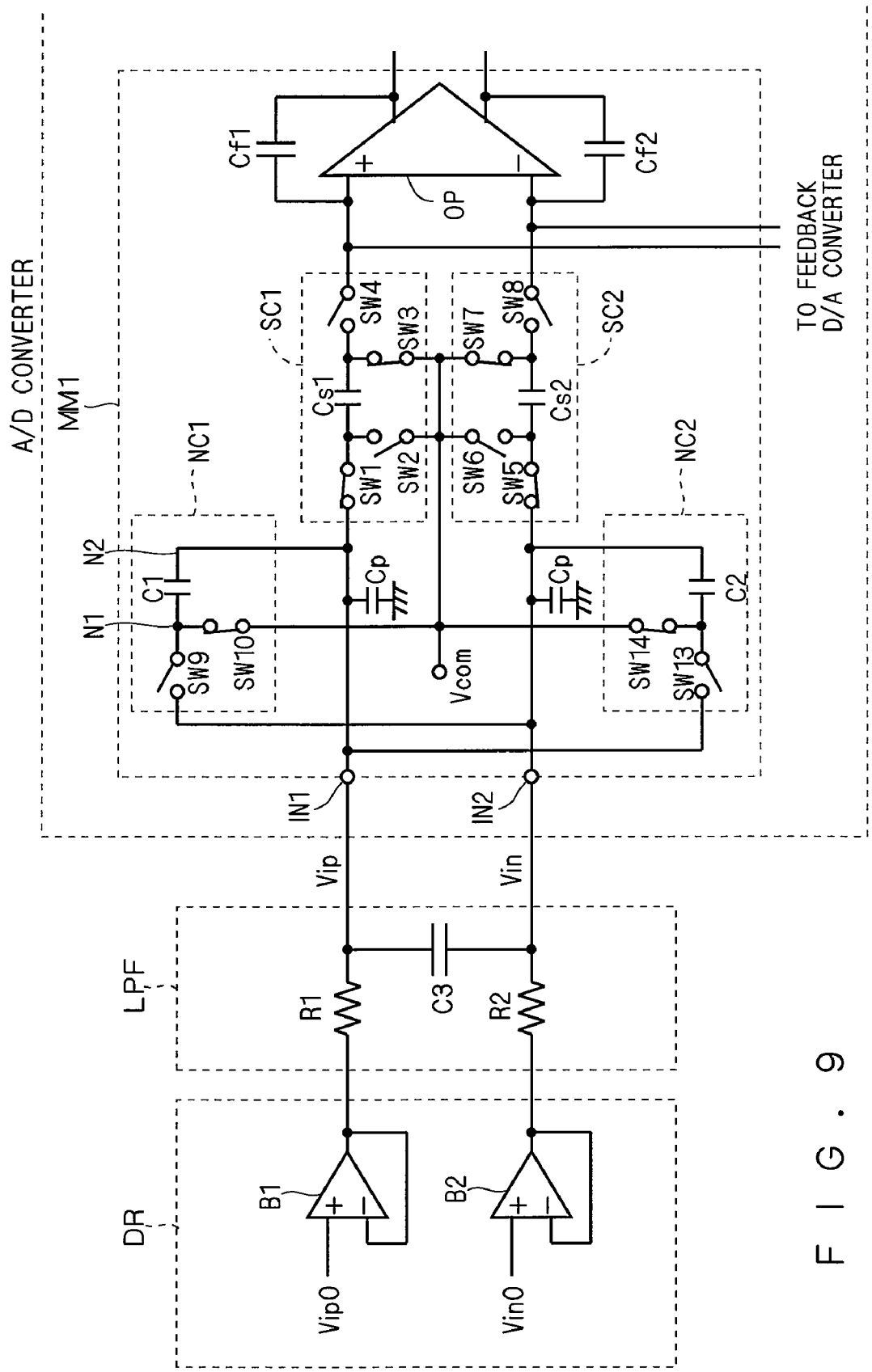
F I G. 9

US 7,710,304 B2

A/D CONVERTER AND SEMICONDUCTOR DEVICE

BACKGROUND OF THE INVENTION

1. Field of the Invention

The present invention relates to an analog/digital converter (A/D converter) including an integration circuit having a switched capacitor circuit in an input section of an analog signal.

2. Description of the Background Art

A technique to convert the analog signal to a 1-bit digital signal by delta sigma ($\Delta\Sigma$) modulation is widely known in the field of the analog/digital converter (A/D converter). A delta sigma modulation circuit includes an integration circuit and a quantizer, and a switched capacitor integration circuit is conventionally frequently used as the integration circuit (refer to "Applied Technology of Signal Processing by OP Amplifier, All About OP Amplifier, Vol. 2", Analog Devices, CQ Publishing, Feb. 1, 2005, p. 115, for example).

In the A/D converter in which the switched capacitor integration circuit is used in an input section of the analog signal, a driver circuit for inputting the analog signal to the A/D converter is connected to the switched capacitor circuit. In such a case, a problem occurs that a spike-like noise (referred to as a "kickback noise") is generated when rapidly charging a sampling capacitor in the switched capacitor circuit, and this is superimposed on an analog signal waveform (detail thereof will be described later). Then, accuracy of the input analog signal is destroyed, so that deterioration in accuracy of A/D conversion occurs.

As measures for solving the problem, it is considered to improve drive ability of the above-described driver circuit and to provide a circuit (refer to a circuit "LPF in FIG. 8") including a capacitative element for supplementing transient outflow and inflow of an electric charge and resistor to prevent an amplifier output of a previous stage from oscillating due to the capacitative element in the input section of the A/D converter, as suggested in "Applied Technology of Signal Processing by OP Amplifier, All About OP Amplifier, Vol. 2", Analog Devices, CQ Publishing, Feb. 1, 2005, p. 115. However, any of the measures is not preferable for increasing a forming area of the circuit. Meanwhile, in this specification, the circuit including the above-described capacitative element (C) and resistor element (R) is referred to as an "RC low-pass filter" for convenience of description.

SUMMARY OF THE INVENTION

An object of the present invention is to suppress an effect of a kickback noise while suppressing increase in a forming area of a circuit in an A/D converter including a switched capacitor integration circuit.

The A/D converter according to the present invention is that to which first and second analog signals forming a differential input signal are input. The integrator, which is an input first-stage section of the A/D converter, includes first and second switched capacitor circuits to which the first and second analog signals are input, respectively, and a noise cancel circuit for generating a signal to cancel the kickback noise generated due to switching operation thereof.

The kickback noise generated in the first and second switched capacitor circuits is cancelled by the signal generated by the noise cancel circuit. Therefore, the effect of the kickback noise in the first and second input signals is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a view showing a configuration of an integrator used in the input section of the A/D converter according to the present invention;

FIGS. 8 and 9 are views showing the configuration of the integrator used in the input section of the A/D converter according to a third embodiment;

DESCRIPTION OF THE PREFERRED EMBODIMENTS

First Embodiment

Figure 1:
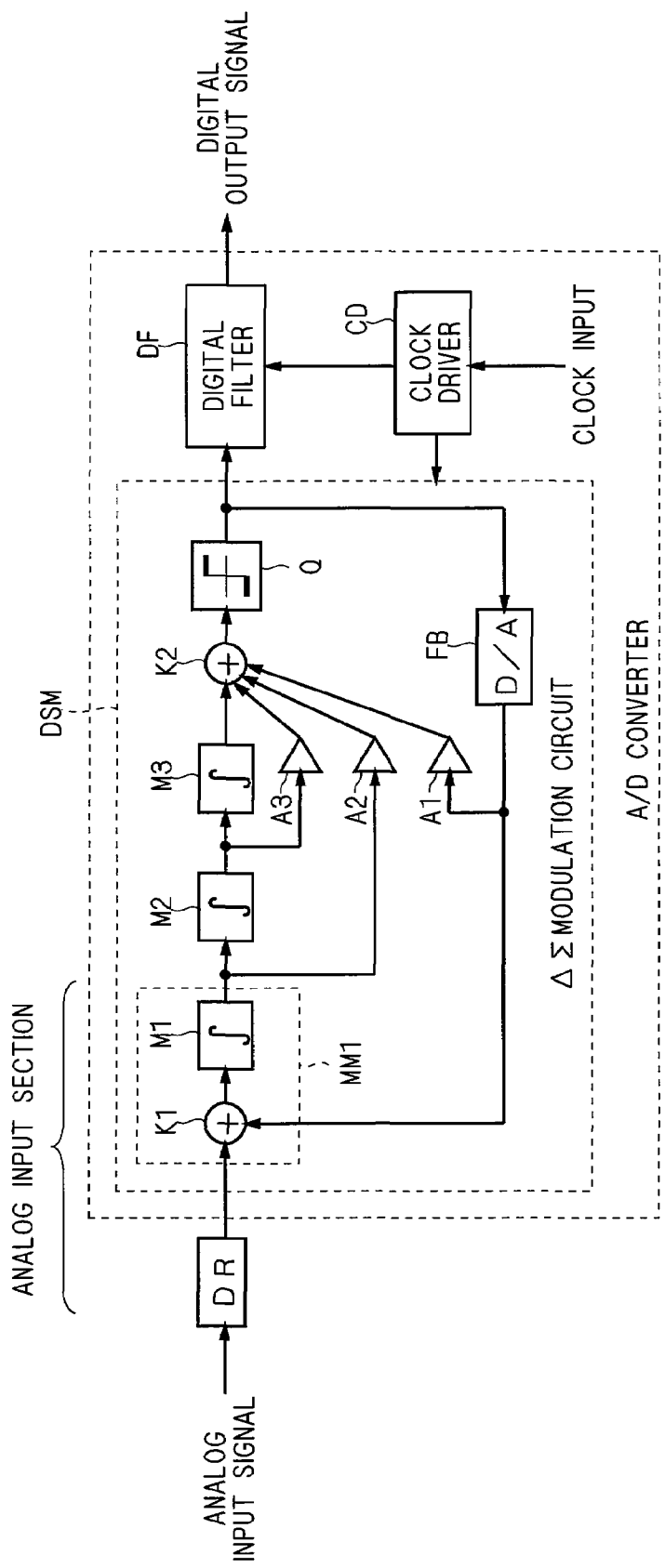
FIG. 1 is a block diagram showing one example of an A/D converter according to the present invention.

FIG. 1 is a block diagram showing one example of an A/D converter according to the present invention. As shown in this drawing, the A/D converter includes a delta sigma modulation circuit DSM and a digital filter DF. Operation timings thereof are defined by a clock signal generated by a clock driver CD. The delta sigma modulation circuit DSM includes integrators M1 to M3, adders K1 and K2, amplifiers A1 to A3, quantizer Q and a feedback D/A modulation circuit FB, as shown in FIG. 1. Meanwhile, although the amplifiers A1 to A3 are shown in the block diagram in FIG. 1, actually, those having a function equivalent to that of the amplifier, such as circuits for amplifying a voltage variation by using a capacity ratio, for example, may replace them. That is to say, the A/D converter to which the present invention is applied is not limited to that using the amplifier as in FIG. 1.

An analog input signal targeted for A/D conversion is input to an A/D conversion circuit through a driver circuit DR. That is to say, the driver circuit DR is provided in a previous stage of the A/D converter relative to the analog input signal and transmits the analog input signal to the A/D converter. The analog input signal input to the delta sigma modulation circuit DSM of the A/D converter is integrated by cascaded integrators M1 to M3. An output from a last-stage integrator M3 is input to the adder K2. Further, the outputs from the integrators M1 and M2 are input to the adder K2 through the amplifiers A2 and A3, respectively, and the output from the feedback D/A converter FB to be described later is input to the same through the amplifier A1. Then, a signal obtained by adding them by the adder K2 is input to the quantizer Q. The quantizer Q is a comparator for outputting "1" when an output voltage of the adder K2 is not smaller than 0 V, and outputting "0" when this is smaller than 0 V, for example. Also, the output from the quantizer Q is fed back to the adder K1 provided on an input side of a first-stage integrator M1 through the feedback D/A converter FB. The output from the quantizer Q is further input to the digital filter DF and is output therethrough as a digital output signal.

As will be clear in a following description, in this embodiment, the present invention is applied to an analog input section of the delta sigma modulation circuit DSM of an over-sampling method, that is to say, a circuit including the driver circuit DR, the adder K1 and the first-stage integrator M1. Hereinafter, the circuit including the function of the adder K1 and the first-stage integrator M1 is referred to as a "first-stage integrator MM1". In addition, the integrator M1 according to the present invention is of a differential input type. That is to say, the analog signal input to the integrator M1 is an analog differential signal.

Figure 2:
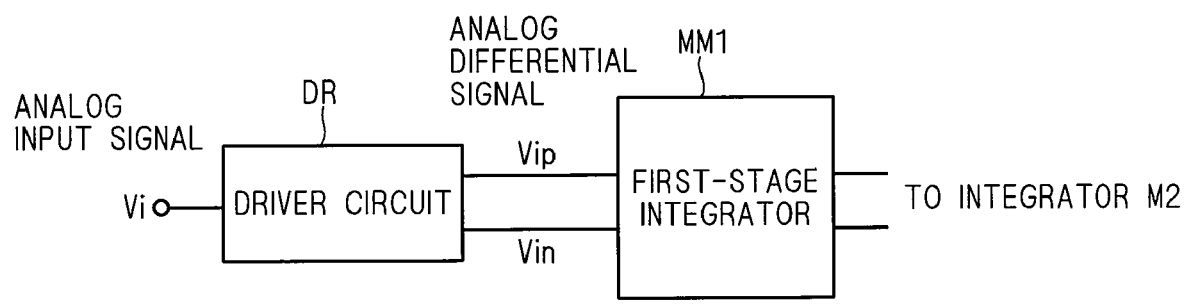
FIG. 2 is a block diagram showing an analog input section of the A/D converter according to the present invention.

That is to say, although the description in FIG. 1 is omitted, actually, the driver circuit DR for generating the differential signal is provided in the previous stage of the first-stage integrator MM1, as shown in FIG. 2, for example. The driver circuit DR receives a single-ended analog signal Vi and generates the differential signal including a signal Vip of the same phase and a signal Vin of an opposite phase to input to the first-stage integrator MM1.

FIG. 3 is a view showing a configuration of the first-stage integrator MM1 used in the input section of the A/D converter according to the present invention. As described above, the driver circuit DR is for generating the differential signal Vip and Vin based on a general analog input signal Vi. In more detail, the driver circuit DR generates differential signals Vip0 and Vin0 from the analog input signal Vi by using an inverting amplifier or the like (not shown), and supplies the differential signals Vip and Vin obtained by enhancing drive ability thereof by buffer circuits B1 and B2, to the first-stage integrator MM1.

Hereinafter, for convenience of description, the signal Vip input to the first-stage integrator MM1 is referred to as a "first input signal" and the opposite-phase signal Vin is referred to as a "second input signal". Meanwhile, a reference voltage Vcom of the first and second input signals Vip and Vin is considered to be a half of the analog supply voltage, for example.

As shown in FIG. 3, the first-stage integrator MM1 includes a differential input type integration circuit including an operation amplifier OP, first and second switched capacitor circuits SC1 and SC2 and feedback capacitors Cf1 and Cf2. The first input signal Vip input to a first input terminal IN1 is supplied to the first switched capacitor circuit SC1, and the second input signal Vin input to a second input terminal IN2 is supplied to the second switched capacitor circuit SC2. The first switched capacitor circuit SC1 includes a sampling capacitor Cs1 and switches SW1 to SW4, and the second switched capacitor circuit SC2 includes a sampling capacitor Cs2 and switches SW5 to SW8.

In the first switched capacitor circuit SC1, the switch SW1 is connected between the first input terminal IN1 and one end of the sampling capacitor Cs1. The switch SW2 is connected between the one end of the sampling capacitor Cs1 and the power supply (reference supply) of the reference voltage Vcom. The switch SW3 is connected between the other end of the sampling capacitor Cs1 and the reference supply. The switch SW4 is connected between the other end of the sampling capacitor Cs1 and a non-inverting input terminal of the operation amplifier OP.

Also, in the second switched capacitor circuit SC2, the switch SW5 is connected between the second input terminal IN2 and one end of the sampling capacitor Cs2. The switch SW6 is connected between the one end of the sampling capacitor Cs2 and the reference supply. The switch SW7 is connected between the other end of the sampling capacitor Cs2 and the reference supply. The switch SW8 is connected between the other end of the sampling capacitor Cs2 and an inverting input terminal of the operation amplifier OP.

The switches SW1 to SW8 are driven based on clock signals $\phi$ and $/\phi$, which are complementary to each other (activated periods thereof are not overlapped). In this embodiment, it is set that the switches SW1, SW3, SW5 and SW7 are turned on when the clock signal $\phi$ is at H level, and the switches SW2, SW4, SW6 and SW8 are turned on when the clock signal $/\phi$ is at the H level (refer to FIGS. 4 and 6). Since the clock signals $\phi$ and $/\phi$ are complementary to each other, the switches SW1, SW3, SW5 and SW7 and the switches SW2, SW4, SW6 and SW8 are alternatively turned on.

Herein, sampling operations of the first and second input signals Vip and Vin by the first and second switched capacitor circuits SC1 and SC2 are described. A sampling cycle is the cycle of the clock signals $\phi$ and $/\phi$, and in one cycle, a period in which the clock signal $\phi$ is at the H level is defined as a "first half of the sampling cycle" and the period in which the clock signal $/\phi$ is at the H level is defined as a "last half of the sampling cycle".

In the sampling operation of the first input signal Vip in the first switched capacitor circuit SC1, an electric charge depending on the first input signal Vip is accumulated in the sampling capacitor Cs1 in the first half of the sampling cycle, and the electric charge is transmitted to the feedback capacitor Cf1 of the integration circuit in the last half of the sampling cycle. Similarly, in the second switched capacitor circuit SC2, the electric charge depending on the second input signal Vin is accumulated in the sampling capacitor Cs2 in the first half of the sampling cycle, and the electric charge is transmitted to the feedback capacitor Cf2 of the integration circuit in the last half of the sampling cycle.

The above-mentioned configuration of the switched capacitor integration circuit is similar to that conventionally used in the first-stage integrator MM1. On the other hand, the first-stage integrator MM1 according to the present invention additionally includes a noise cancel circuit NC connected to the first and second input terminals IN1 and IN2, as shown in FIG. 3. That is to say, the noise cancel circuit NC is connected between the first and second switched capacitor circuits SC1 and SC2 of the first-stage integrator MM1 and the driver circuit DR. The noise cancel circuit NC is for canceling a kickback noise due to the operation of the first and second switched capacitor circuits SC1 and SC2, thereby suppressing an effect of the noise to each of the first and second input signals Vip and Vin.

Meanwhile, a capacitance component Cp shown in FIG. 3 represents a parasitic capacitance associated with a wiring to which the first and second input terminals IN1 and IN2 are connected, respectively.

Figure 4:
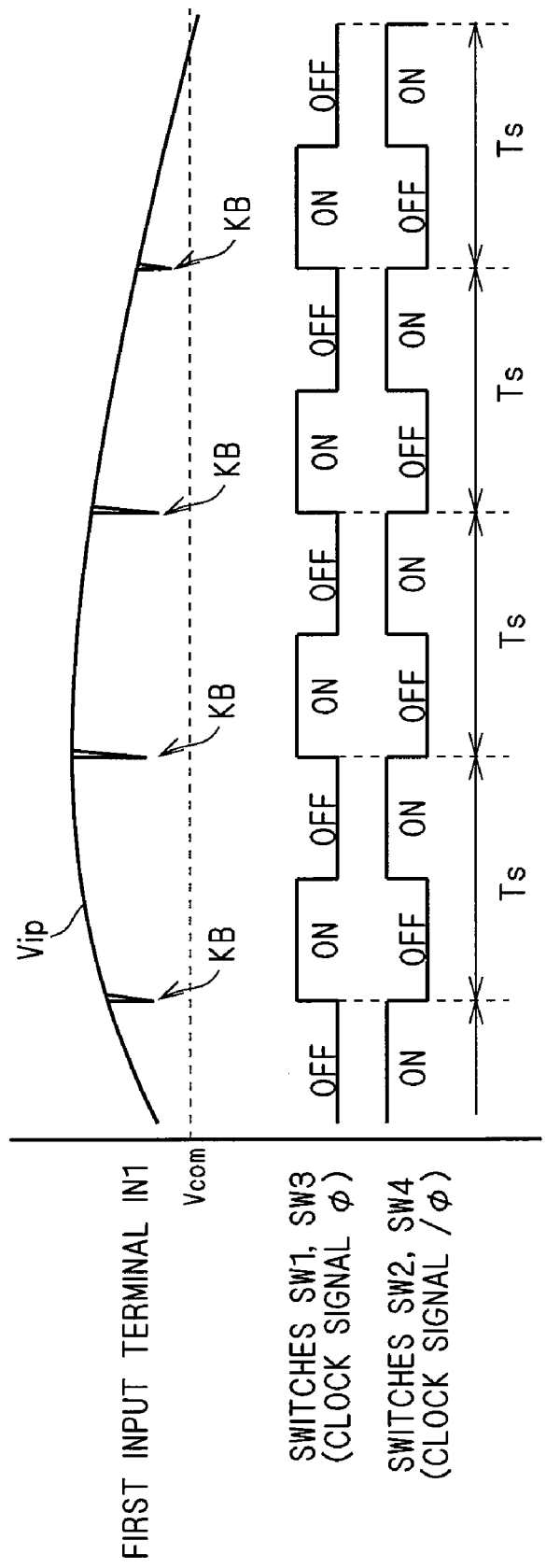
FIG. 4 is a timing diagram showing operation of the conventional integrator.

Herein, the above-mentioned "kickback noise" is described. FIG. 4 is a timing diagram showing an operation of the conventional first-stage integrator MM1 (that is to say, that not having the noise cancel circuit NC in FIG. 3). Since the first and second switched capacitor circuits SC1 and SC2 operate essentially similarly, the operation of the first switched capacitor circuit SC1 is representatively shown.

As described above, in the first switched capacitor circuit SC1, the switches SW1 and SW3 are turned off and the switches SW2 and SW4 are turned on in the last half of the sampling cycle Ts, and the electric charge of the sampling capacitor Cs1 is transmitted to the feedback capacitor Cf1. The sampling capacitor Cs1 at that time is in a state in which the electric charge is not accumulated. Therefore, when the switches SW1 and SW3 are turned on and the switches SW2 and SW4 are turned off at a head of a next sampling cycle Ts, the electric charge of the first input signal Vip moves to the sampling capacitor Cs1, and as shown in FIG. 4, a momentary spike-like variation KB is generated in the level of the first input signal Vip at the head of the sampling cycle. The variation KB is the "kickback noise". Although the description is omitted, in the second switched capacitor circuit SC2 also, when the switches SW5 and SW7 are turned on (head of the sampling cycle Ts), similar kickback noise is generated in the second input signal Vin.

An amount of electric charge flowing out of the first input terminal IN1 to the sampling capacitor Cs1 when the switches SW1 and SW3 are turned on is Cs1·(Vip−Vcom). When a size of the kickback noise KB generated thereby is set to ΔV[KB], this may be represented as:

Equation 1

$$\Delta V[KB] = \frac{1}{Cs1 + Cp} \{Cs1 \cdot (Vip - Vcom)\} \quad \text{Equation (1)}$$

The first-stage integrator MM1 according to the present invention is provided with the noise cancel circuit NC as measures against the kickback noise.

As described above, the first and second switched capacitor circuits SC1 and SC2 generate the kickback noise when the connection of each switch is switched depending on the clock signal defining the sampling cycle. The noise cancel circuit NC also includes a plurality of switches, and by switching the connection of each switch depending on the clock signal similarly, this generates the kickback noise of which polarity is opposite to that of the above-described kickback noise, thereby canceling the noise of the former.

Figure 5:
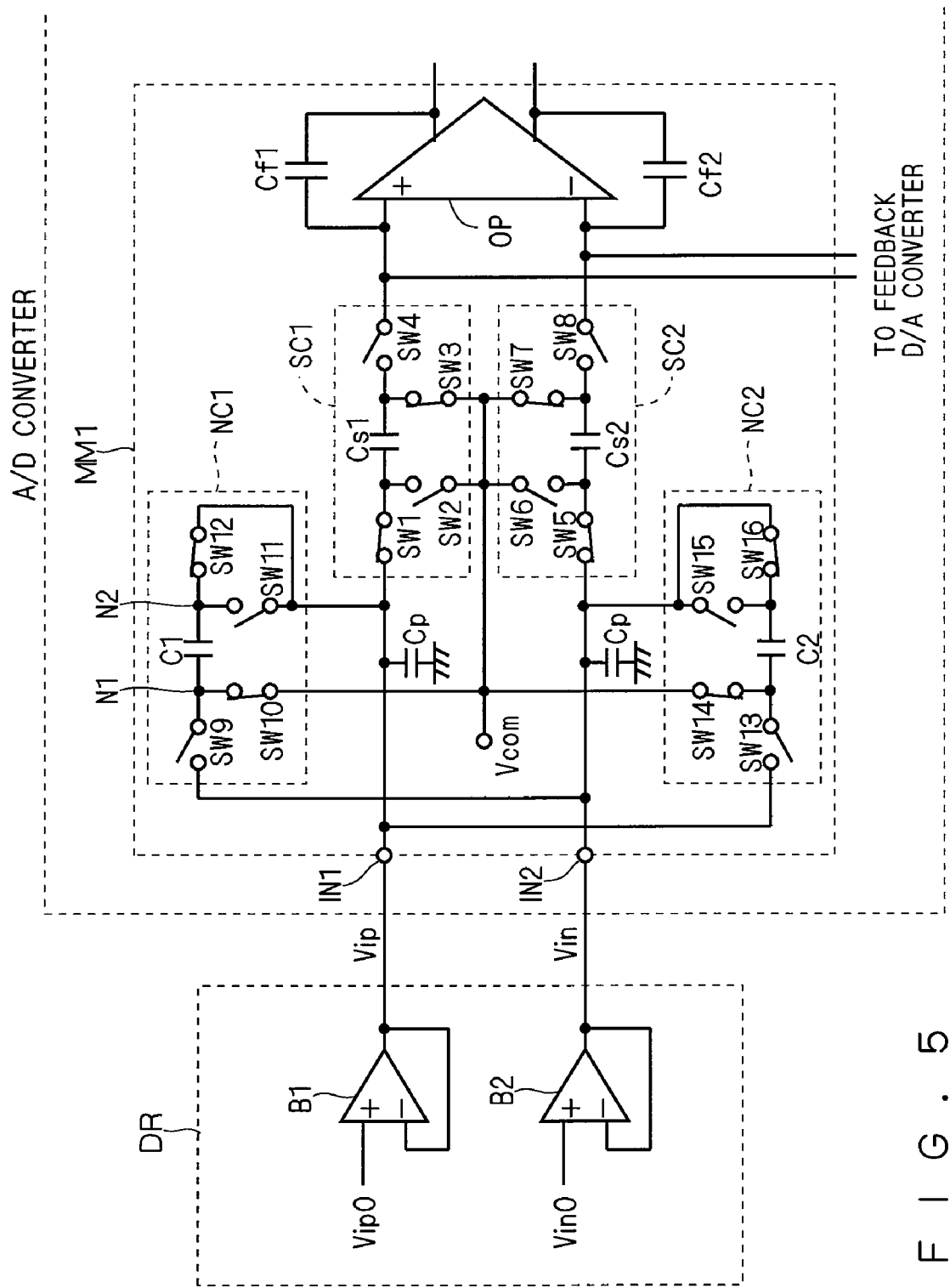
FIG. 5 is a view showing the configuration of the integrator used in the input section of the A/D converter according to a first embodiment.

FIG. 5 is a view showing a configuration of the first-stage integrator MM1 used in the input section of the A/D converter according to the first embodiment, and this shows a specific circuit configuration example of the first noise cancel circuit NC1. In this embodiment, the noise cancel circuit NC includes a first noise cancel circuit NC1 for canceling the kickback noise in the first input signal Vip and a second noise cancel circuit NC2 for canceling the kickback noise in the second input signal Vin.

In this embodiment, as shown in FIG. 5, the first and second noise cancel circuits NC1 and NC2 have substantially the same circuit configurations as those of the first and second switched capacitors SC1 and SC2, respectively, and each of them includes one capacitor and four switches.

That is to say, the first noise cancel circuit NC1 includes a capacitor C1 and the switches SW9 to SW12 connected to the same. A capacitance value of the capacitor C1 is set so as to be the same as that of the sampling capacitor Cs1. One end of the capacitor C1 is connected to the first input terminal IN1 through parallelly-connected switches SW11 and SW12. The other end of the capacitor C1 is connected to the second input terminal IN2 through the switch SW9 and is connected to the reference supply (reference voltage Vcom) through the switch SW10.

Similarly, the second noise cancel circuit NC2 includes a capacitor C2 and switches SW13 to SW16 connected to the same. The capacitance value of the capacitor C2 is set so as to be the same as that of the sampling capacitor Cs2. One end of the capacitor C2 is connected to the second input terminal IN2 through parallelly-connected switches SW15 and SW16. The other end of the capacitor C2 is connected to the first input terminal IN1 through the switch SW13 and is connected to the reference supply (reference voltage Vcom) through the switch SW14.

The switches SW10, SW12, SW14 and SW16 out of the switches SW9 to SW16 are turned on in the first half of the sampling cycle Ts like the switches SW1, SW3, SW5 and SW7. Also, the switches SW9, SW11, SW13 and SW15 are turned on in the last half of the sampling cycle Ts like the switches SW2, SW4, SW6 and SW8.

Figure 6:
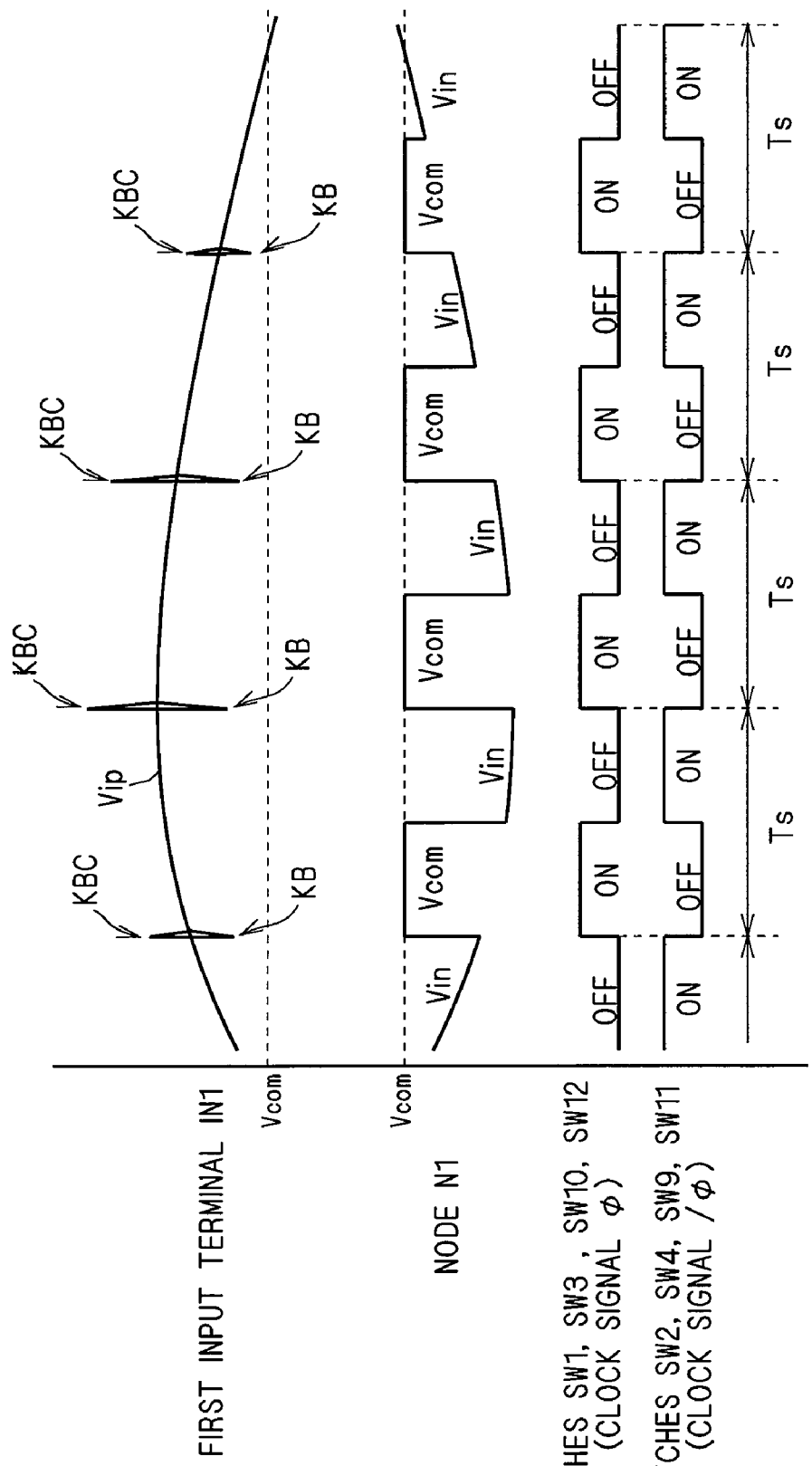
FIG. 6 is a timing diagram showing the operation of the integrator used in the input section of the A/D converter according to the first embodiment.

FIG. 6 is a timing diagram showing the operation of the first-stage integrator MM1 according to the first embodiment. A group of the first switched capacitor circuit SC1 and the first noise cancel circuit NC1 and a group of the second switched capacitor circuit SC2 and the second noise cancel circuit NC2 operate essentially similarly, so that the operation of the former is representatively shown herein. In addition, for convenience of description, as shown in FIG. 5, a connection node between the capacitor C1 and the switches SW9 and SW10 is defined as a node N1, and the connection node between the capacitor C1 and the switches SW11 and SW12 is defined as a node N2.

In the first noise cancel circuit NC1, since the switches SW9 and SW11 are on and the switches SW10 and SW12 are off in the last half of the sampling cycle Ts, the node N1 reaches the level of the second input signal Vin and the node N2 reaches the level of the first input signal Vip. Then, in the next sampling cycle Ts, when the switches SW9 and SW11 are turned off and the switches SW10 and SW12 are turned on, the voltage of the node N1 changes from the level of the second input signal Vin to the reference voltage Vcom. At that time, the voltage of the node N2 also changes depending on the voltage variation of the node N1 due to capacitance coupling between the nodes N1 and N2 through the capacitor C1. As a result, the electric charge flows from the node N2 to the first input terminal IN1 through the switch SW12. The amount of the electric charge is C1·(Vcom−Vin) and the electric charge tries to generate a voltage variation KBC as shown in FIG. 6 in the first input terminal IN1 at the head of the sampling cycle.

Meanwhile, as described later, the electric charge flowing from the node N2 to the first input terminal IN1 at that time is cancelled by the outflow of the electric charge from the first input terminal IN1 associated with the kickback noise KB, so that actually the voltage variation KBC and the kickback noise KB hardly occur. In FIG. 6, for convenience of description, both of the voltage variation KB and KBC are clearly shown.

At the timing that the switches SW10 and SW12 are turned on, the switches SW1 and SW3 are turned on, so that as in the above-described conventional example, the electric charge of Cs1·(Vip−Vcom) flows out from the first input terminal IN1 toward the sampling capacitor Cs1. The electric charge tries to generate the kickback noise KB shown in FIG. 6.

As is clear from FIG. 6, positive and negative direction of the voltage variation KBC, which the first noise cancel circuit NC1 tries to generate in the first input terminal IN1, is opposite to that of the kickback noise KB. Although the kickback noise KB is generated by the outflow of the electric charge from the first input terminal IN1 to the sampling capacitor Cs1, the electric charge flows from the first noise cancel circuit NC1 to the first input terminal IN1 at the same timing, so that the kickback noise KB is cancelled. Therefore, the voltage variation KBC acts as a "noise cancel signal" to cancel the kickback noise KB.

As described above, although both of the kickback noise KB and the noise cancel signal KBC are clearly shown for convenience of description in FIG. 6, actually, both of them cancel each other, and the first input signal Vip is a gentle waveform with very little effect of the kickback noise KB and the noise cancel signal KBC. Hereinafter, the detail thereof is described.

In the first input terminal IN1, the outflow of the electric charge, which generates the kickback noise KB, is $Cs1 \cdot (Vip - Vcom)$, and the inflow of the electric charge associated with the noise cancel signal KBC is $C1 \cdot (Vcom - Vin)$. Therefore, the voltage variation $\Delta V[IN1]$ of the first input terminal In1 when the movement of the electric charge is generated is represent as:

Equation 2

$$\Delta V[IN1] = \frac{1}{Cs1 + C1 + Cp} \{Cs1 \cdot (Vip - Vcom) - C1 \cdot (Vcom - Vin)\} \quad \text{Equation (2)}$$

Herein, Vip in the equation (2) is a value when the switch SW1 is turned on (head of the sampling cycle) and Vin is the value just before the switch SW9 is turned off (last half of the sampling cycle Ts), so that a time-lag up to a half of the sampling cycle Ts might exist therebetween. However, since the A/D converter is of the over-sampling type, sampling frequency (1/Ts) is from several times to several tens of times of the frequencies of the first and second input signal Vip and Vin. Therefore, variation in values of the first and second input signals Vip and Vin in one sampling cycle Ts is not large. Further, since the first and second input signals Vip and Vin form the differential signal, in the equation (2), a relationship $(Vip-Vcom) \approx (Vin-Vcom)$ is satisfied.

Further, in this embodiment, C1 and Cs1 are set to the same value. Therefore, in the equation (2), $\{Cs1 \cdot (Vp-Vcom)-C1 \cdot (Vin-Vcom)\} \approx 0$ is satisfied, so that $\Delta V[IN1] \approx 0$ is satisfied.

As described above, according to this embodiment, the kickback noise KB generated due to the operation of the first switched capacitor circuit SC1 is cancelled by the noise cancel signal KBC generated by the first noise cancel circuit NC1. Therefore, the effect of the kickback noise in the first input signal Vip is suppressed. Also, although the description is omitted, similarly, the kickback noise KB generated by the second switched capacitor circuit SC2 is cancelled by the noise cancel signal KBC generated by the second noise cancel circuit NC2. Therefore, the effect of the kickback noise KB in the second input signal Vin also is suppressed.

As described above, as means for suppressing the kickback noise KB, it is considered to improve drive ability of the driver circuit (buffer circuits B1 and B2) and to provide an RC low-pass filter in the input section of the A/D converter, however, the means has been accompanied with increase in forming area of the circuit.

In this embodiment, it is required to newly provide the first and second noise cancel circuits NC1 and NC2, however, they do not include an element requiring a large forming area, such as a transistor of which drive ability is large and a large-capacity capacitor, so that they may be formed with a relatively small area. Therefore, the effect to suppress the increase in a circuit area may be obtained.

Meanwhile, in the above-described example, an ideal example in which the effect of the kickback noise KB is substantially 0 by generating the noise cancel signal KBC having substantially the same size as that of the kickback noise KB by the first noise cancel circuit NC1 has shown (above-described equation (2)). However, due to variation or the like in the electrical characteristics of each element, it is sufficiently possible that the amplitude of the noise cancel signal KBC differs from the amplitude of the kickback noise KB, for example. In such a case, it may not be possible to completely cancel the kickback noise KB, however, the effect to reduce the effect of the kickback noise KB may be obtained.

In fact, there is a case in which a certain degree of noise is allowable depending on the signal to be handled, and it is not required that the effect of the kickback noise KB is always set to 0. Therefore, deviation of the switching characteristics in the switches SW1 to SW16 and the variation of the capacitance values of the capacitors C1 and C2 and the sampling capacitors Cs1 and Cs2 may be allowed to a certain degree.

Second Embodiment

Figure 7:
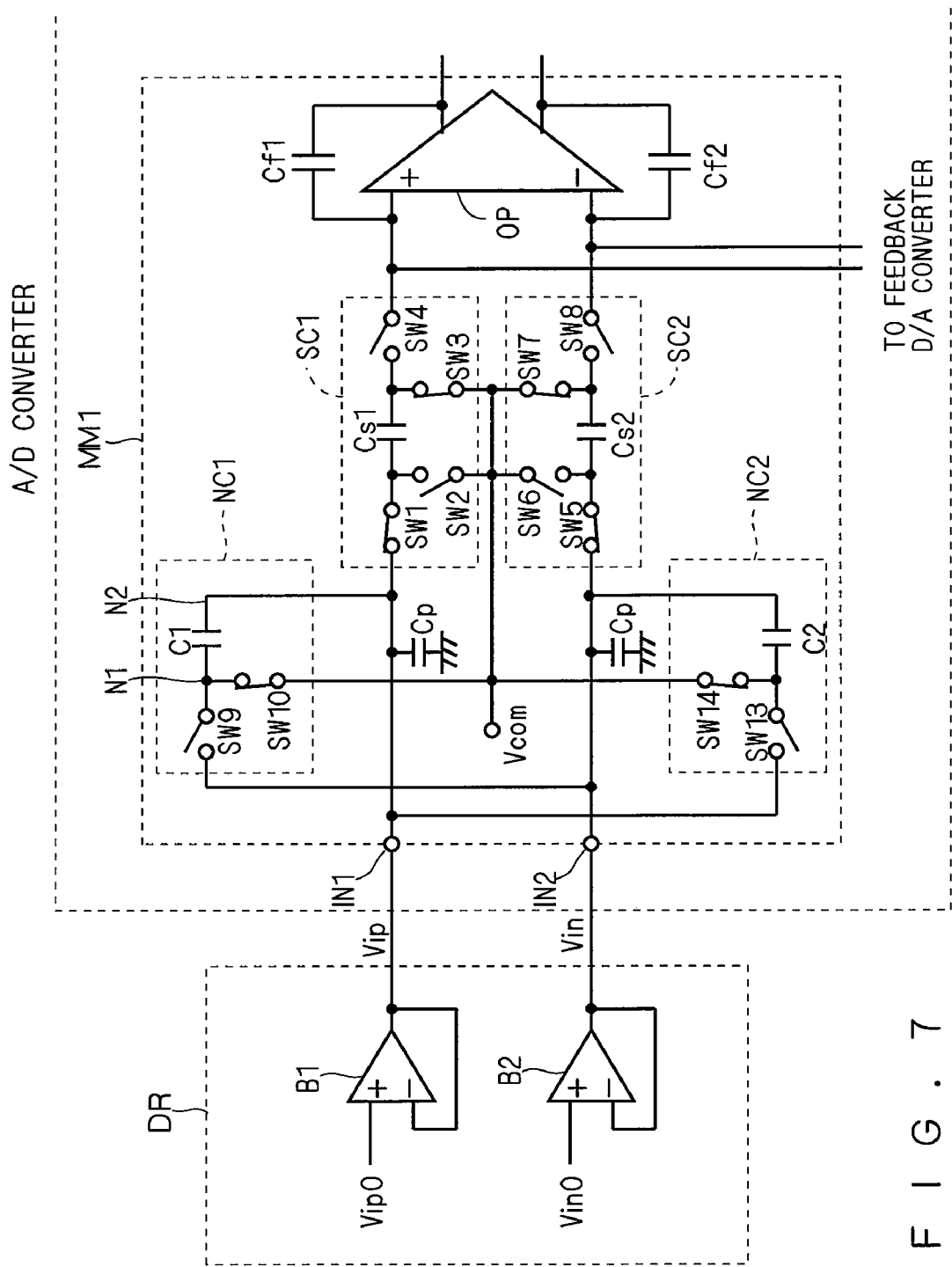
FIG. 7 is a view showing the configuration of the integrator used in the input section of the A/D converter according to a second embodiment.

FIG. 7 is a view showing the configuration of the first-stage integrator MM1 according to a second embodiment. The first-stage integrator MM1 is obtained by omitting the switches SW11 and SW12 of the first noise cancel circuit NC1 and the switches SW15 and SW16 of the second noise cancel circuit NC2 from the circuit in FIG. 5. That is to say, one end (node N2) of the capacitor C1 is directly connected to the first input terminal IN1 and one end of the capacitor C2 is directly connected to the second input terminal IN2.

By thus configuring also, the first noise cancel circuit NC1 may supply the noise cancel signal KBC to the first input terminal IN1 when the switch SW10 is turned on at the head of the sampling cycle Ts. Similarly, the second noise cancel circuit NC2 may supply the noise cancel signal KBC to the second input terminal IN2 when the switch SW14 is turned on at the head of the sampling cycle Ts. Therefore, the substantially similar effect as in the first embodiment may be obtained. Also, there is the effect that the forming area of the circuit is reduced by an amount that the switches SW11, SW12, SW15 and SW16 are omitted.

However, although the first and second switched capacitor circuits SC1 and SC2 and the first and second noise cancel circuits NC1 and NC2 have substantially the same circuit configurations in the first embodiment, the circuit configurations of both are not the same in this embodiment. Therefore, slight difference in time constant occurs between the first and second switched capacitor circuits SC1 and SC2 and the first and second noise cancel circuits NC1 and NC2. Therefore, it should be noted that there is a possibility that a difference between the waveform of the kickback noise KB and the waveform of the noise cancel signal KBC becomes large and the effect that the noise cancel signal KBC cancels the kickback noise KB is slightly lowered.

Third Embodiment

Figure 8:
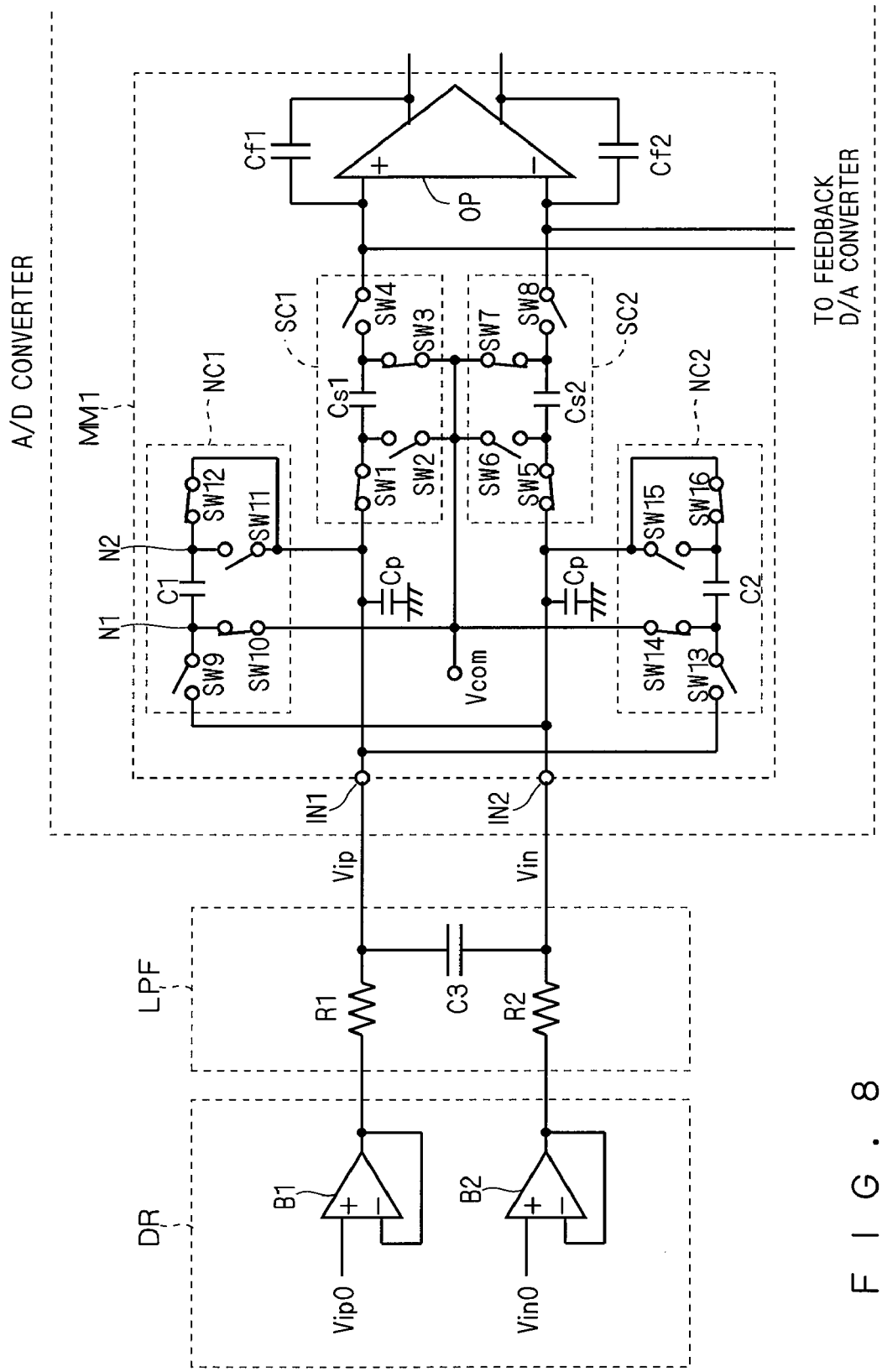

FIG. 8 is a view showing the configuration of the first-stage integrator MM1 used in the input section of the A/D converter according to the third embodiment. In this embodiment, a low-pass filter LPF is provided in the previous stage of the first-stage integrator MM1 of the first embodiment (FIG. 5), that is to say, between the driver circuit DR and the first-stage integrator MM1.

As in FIG. 8, the low-pass filter LPF is a so-called an "RC low-pass filter" including resistor elements R1 and R2 and a capacitor C3. The resistor element R1 is connected between an output terminal of the buffer circuit B1 for outputting the first input signal Vip and the first input terminal IN1 of the first-stage integrator MM1. The resistor element R2 is connected between the output terminal of the buffer circuit B2 for outputting the second input signal Vin and the second input terminal IN2 of the first-stage integrator MM1. Also, the capacitor C3 is connected between the first input terminal IN1 and the second input terminal IN2.

That is to say, the first and second input signals Vip and Vin are input to the first and second input terminals IN1 and IN2, respectively, through the low-pass filter LPF. According to this configuration, when the switches SW1 and SW5 are turned on at the head of the sampling cycle and the outflow of electric charge from the first and second input terminals IN1 and IN2 to the sampling capacitors Cs1 and Cs2, respectively, is generated, the capacitor C3 supplements a part of the outflowing electric charge, so that the effect of the first and second input signals Vip and Vin kickback noise KB may further be suppressed.

Meanwhile, as described above, the technique to provide the RC low-pass filter in the input section of the first-stage integrator MM1 is conventionally known in "Applied Technology of Signal Processing by OP Amplifier, All About OP Amplifier, Vol. 2", Analog Devices, CQ Publishing, Feb. 1, 2005, p. 115. In addition, in order to sufficiently suppress the kickback noise KB by the RC low-pass filter, it is required to enlarge the size of the capacitor and the resistor element, so that increase in forming area associated therewith has been considered as a problem.

In this embodiment, the first and second noise cancel circuits NC1 and NC2 are used together with the low-pass filter LPF, and this suppresses the kickback noise KB to a relatively small level. Therefore, it is not required to use the low-pass filter LPF to be provided therewith in which the size of the resistor elements R1 and R2 and the capacitor C3 is so large. Accordingly, the forming area may be made smaller than that in a conventional case in which only the RC low-pass filter is used. In addition, by using the low-pass filter LPF and the first and second noise cancel circuits NC1 and NC2 of the present invention together, it is possible to more surely suppress the generation of the kickback noise KB.

Meanwhile, this embodiment is applicable to the first-stage integrator MM1 of the second embodiment (FIG. 7). That is to say, as in FIG. 9, the low-pass filter LPF may be provided in the input section of the first-stage integrator MM1 of the second embodiment, and in this case also, the effect similar to that in the above description may be obtained.

Fourth Embodiment

Figure 10:
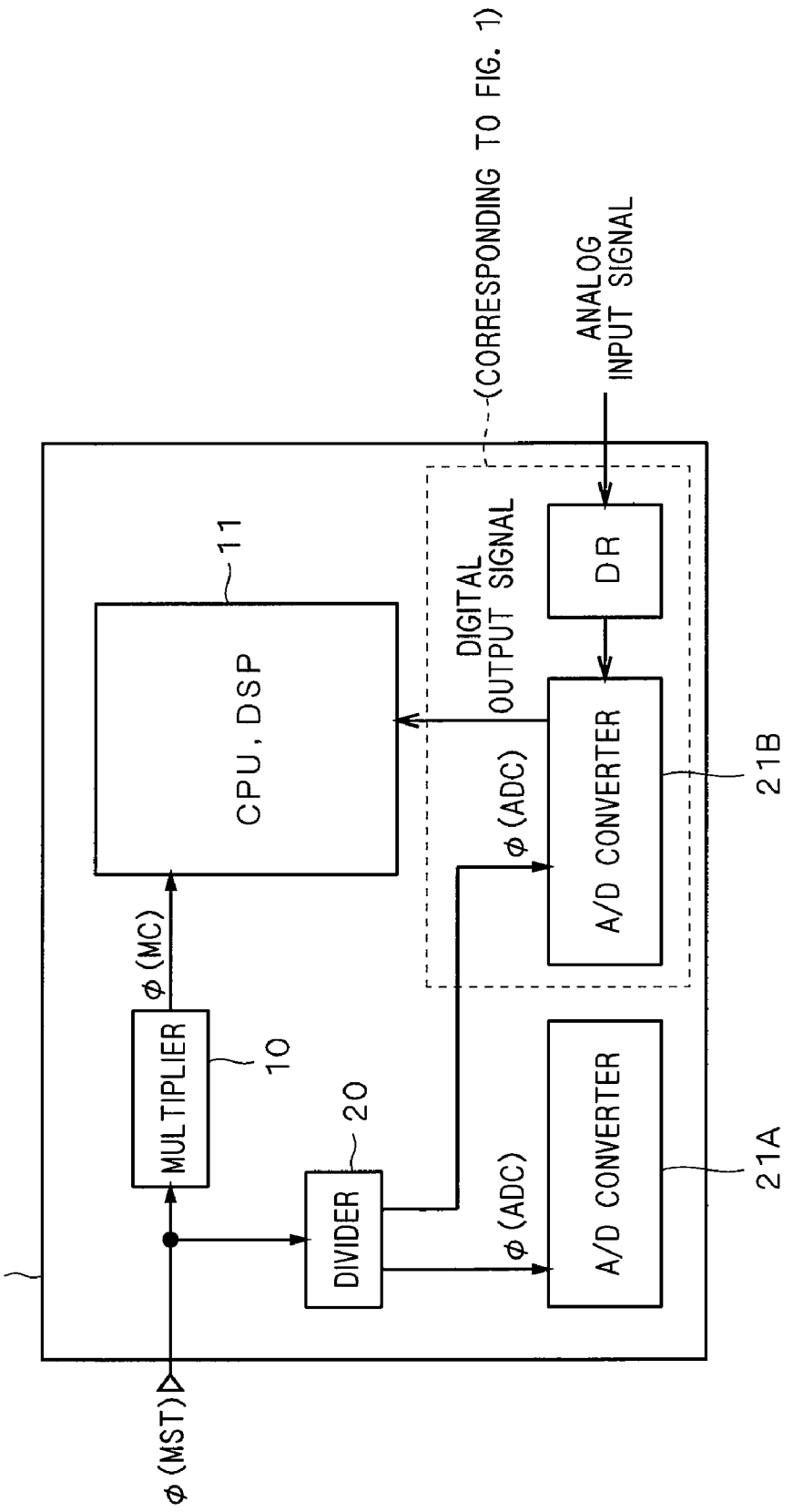
FIG. 10 is a view showing the configuration of the integrator used in the input section of the A/D converter according to a fourth embodiment.

In this embodiment, a technique effective when mounting the A/D converter according to the present invention on one chip together with another digital circuit is described. FIG. 10 is a view showing the configuration of the semiconductor device according to this embodiment. As shown in FIG. 10, in the semiconductor device, a microcomputer 11 including CPU (Central Processing Unit) and DSP (Digital Signal Processor) is formed as a digital circuit on one chip 100 together with two A/D converters 21A and 21B. The A/D converter 21B includes the first-stage integrator MM1 according to the present invention shown above, and the analog input signal is input to the same through the driver circuit DR also formed on the chip 100. The microcomputer 11 receives a digital signal generated by the A/D converter 21B based on the analog input signal, which is input.

The operation timings of the microcomputer 11 and the A/D converters 21A and 21B are defined by predetermined clock signals. In the semiconductor device, each clock signal is generated based on a master clock signal MCK input from outside of the chip 100. For example, the clock signal $\phi$ (MC) for the microcomputer 11 is generated by multiplying the master clock signal $\phi$ (MST) by a multiplier 10. Also, the clock signal $\phi$ (ADC) for the A/D converters 21A and 21B is generated by dividing the master clock signal $\phi$ (MST) by a divider 20.

Meanwhile, although many devices may be formed on one chip other than them in an actual semiconductor device, for convenience of description, only the above elements are shown.

Figure 11:
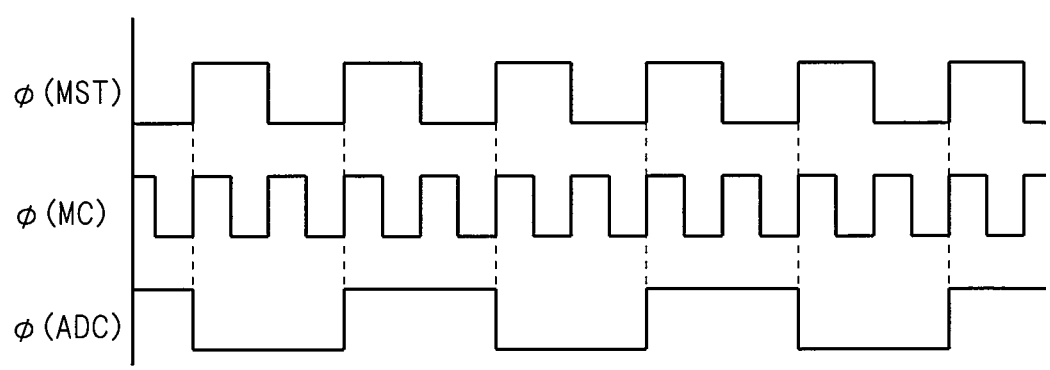
FIG. 11 is a view showing an operation clock of the conventional semiconductor device.

FIG. 11 is a view showing a phase relationship of each clock signal in the conventional semiconductor device. In a case in which the clock signal $\phi$ (MC) for the microcomputer 11 is generated by multiplying the master clock signal $\phi$ (MST) and the clock signal $\phi$ (ADC) for the A/D converters 21A and 21B is generated by dividing the same master clock signal $\phi$ (MST) as described above, the phases thereof are generally aligned to each other. That is to say, in the conventional semiconductor device, as shown in FIG. 11, timings (edge timings) of rising and trailing of the master clock signal $\phi$ (MST), the clock signal $\phi$ (MC) and $\phi$ (ADC) are aligned to each other.

In the microcomputer 11 (digital circuit), there is a tendency that a passing current increases at the edge timing of the master clock signal $\phi$ (MST) and the clock signal $\phi$ (MC), and there is a case in which a noise due to a current variation circulates around the A/D converters 21A and 21B (analog section) through a silicon substrate or the like.

Figure 12:
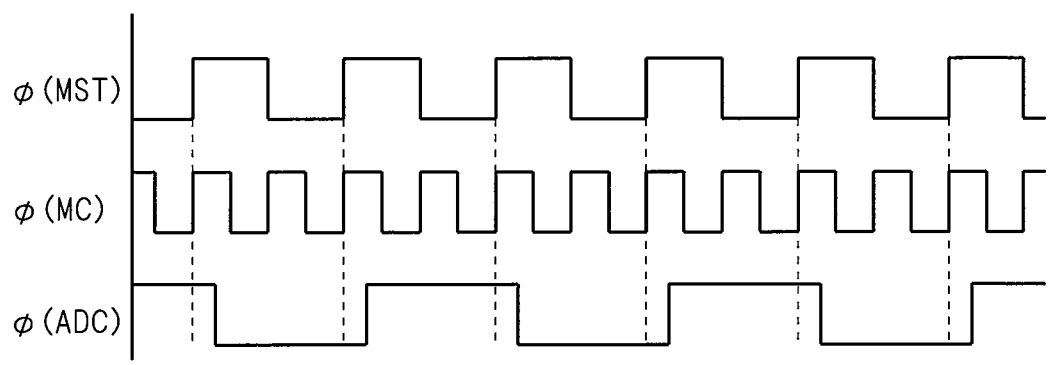
FIG. 12 is a view showing the operation clock of a semiconductor device according to the fourth embodiment.

Thus, in this embodiment, the edge timing of the clock signal $\phi$ (ADC) is slightly delayed by allowing the divider 20 to have delay function. Thereby, as shown in FIG. 12, the edge timing of the clock signal $\phi$ (ADC) is shifted from the edge timings of the master clock signal $\phi$ (MST) and the clock signal $\phi$ (MC). Thereby, the A/D converters 21A and 21B are less subject to the above-described noise.

As described above, the A/D converters 21A and 21B include the first-stage integrator MM1 according to the present invention. That is to say, the first-stage integrator MM1 includes the first and second noise cancel circuits NC1 and NC2. The first and second noise cancel circuits NC1 and NC2 also are less subject to the above-described noise, so that the effect that the accuracy of cancel of the kickback noise KB is improved may be obtained.

Fifth Embodiment

Although the A/D converter using the delta sigma modulation circuit has been described in each of the embodiments, the application of the present invention is not limited to this. This may be widely applicable to the A/D converter including the switched capacitor circuit in the input first-stage section (analog input section) thereof, such as the A/D converter using a sample hold circuit (sample hold type A/D converter).

Figure 13:
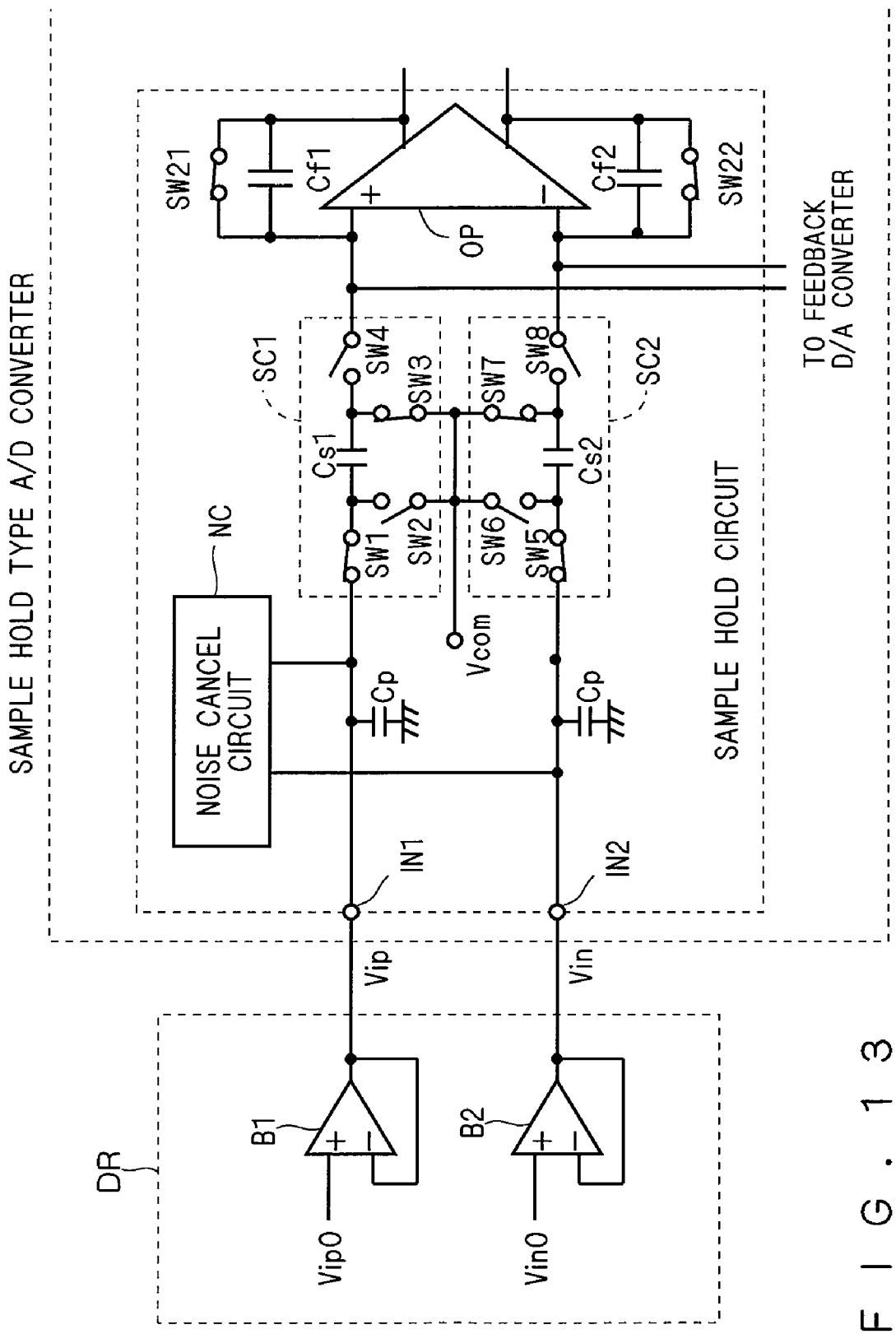
FIG. 13 is a view showing the configuration of a sample hold circuit used in the input section of the A/D converter according to a fifth embodiment.

FIG. 13 shows the circuit in a case in which this embodiment is applied to the input first-stage section of the sample hold type A/D converter. This drawing corresponds to FIG. 3 shown above, and the same reference numerals are given to components having similar function as those shown in FIG. 3, so that the description thereof is omitted. Also, an entire configuration of the sample hold type A/D converter may be the same as that in FIG. 1, however, the sample hold circuits replace the integrators M1 to M3, respectively.

As shown in FIG. 13, the configuration of the input first stage section of the sample hold type A/D converter is substantially similar to the first-stage integrator MM1 in FIG. 3, switches SW21 and SW22 are parallely connected to the feedback capacitors Cf1 and Cf2, respectively, in addition to this configuration. The switch SW21 is turned on and off like the switches SW1 and SW3, and the switch SW22 is turned on and off like the switches SW5 and SW7. The noise cancel circuit NC is connected between the first and second switched capacitor circuits SC1 and SC2 included in the sample hold circuit and the driver circuit DR.

In addition, although the description thereof is omitted herein, the circuit configurations of the noise cancel circuit NC of the above-described first embodiment (FIG. 5) and second embodiment (FIG. 7) are applicable. Also, it is possible to combine the same with the low-pass filter LPF as in the third embodiment, and of course it is possible to apply the fourth embodiment when forming the same on one chip together with the digital circuit such as the microcomputer.

While the invention has been shown and described in detail, the foregoing description is in all aspects illustrative and not restrictive. It is therefore understood that numerous modifications and variations can be devised without departing from the scope of the invention.

What is claimed is:

1. A differential input type A/D converter comprising an integration circuit or a sample hold circuit including first and second switched capacitor circuits to which first and second analog signals of opposite polarity are input, respectively, wherein
    said first switched capacitor circuit includes:
    a first sampling capacitor;
    a first switch connected between a first input terminal to which said first analog signal is input and one end of said first sampling capacitor and is turned on at a first timing; and
    a second switch connected between said one end of said first sampling capacitor and a reference supply and is turned on at a second timing, and wherein
    said second switched capacitor circuit includes:
    a second sampling capacitor;
    a third switch connected between a second input terminal to which said second analog signal is input and one end of said second sampling capacitor and is turned on at said first timing; and
    a fourth switch connected between said one end of said second sampling capacitor and a reference supply and is turned on at said second timing, and wherein
    said A/D converter further includes:
    a first noise cancel circuit for supplying a signal to cancel a kickback noise generated in said first input terminal when said first switch is turned on to said first input terminal at said first timing; and
    a second noise cancel circuit for supplying the signal to cancel the kickback noise generated in said second input terminal when said third switch is turned on to said second input terminal at said first timing.

2. The A/D converter according to claim 1, wherein
    said first noise cancel circuit includes:
    a first capacitor;
    fifth and sixth switches connected between said first input terminal and one end of said first capacitor and are turned on at said first and second timings, respectively;
    a seventh switch connected between said second input terminal and the other end of said first capacitor and is turned on at said second timing; and
    an eighth switch connected between said reference supply and said other end of said first capacitor and is turned on at said first timing, and wherein
    said second noise cancel circuit includes:
    a second capacitor;
    ninth and tenth switches connected between said second input terminal and one end of said second capacitor and are turned on at said first and second timings, respectively;
    an eleventh switch connected between said first input terminal and the other end of said second capacitor and is turned on at said second timing; and
    a twelfth switch connected between said reference supply and said other end of said second capacitor and is turned on at said first timing.

3. The A/D converter according to claim 1, wherein
    said first noise cancel circuit includes:
    a first capacitor having one end connected to said first input terminal;
    a fifth switch connected between said second input terminal and the other end of said first capacitor and is turned on at said second timing; and
    a sixth switch connected between said reference supply and said other end of said first capacitor and is turned on at said first timing, and wherein
    said second noise cancel circuit includes:
    a second capacitor having one end connected to said second input terminal;
    a seventh switch connected between said first input terminal and the other end of said second capacitor and is turned on at said second timing; and
    an eighth switch connected between said reference supply and said other end of said second capacitor and is turned on at said first timing.

4. The A/D converter according to claim 2, wherein the A/D converter operates using an over sampling method.

5. The A/D converter according to claim 4, wherein
    a capacitance value of said first capacitor is substantially the same as the capacitance value of said first sampling capacitor; and
    the capacitance value of said second capacitor is substantially the same as the capacitance value of said second sampling capacitor.

6. The A/D converter according to claim 3, wherein the A/D converter operates using an over sampling method.

7. The A/D converter according to claim 6, wherein
    a capacitance value of said first capacitor is substantially the same as the capacitance value of said first sampling capacitor; and
    the capacitance value of said second capacitor is substantially the same as the capacitance value of said second sampling capacitor.

8. The A/D converter according to claim 1, further comprising a low-pass filter in a previous stage of said first and second switched capacitors, wherein
    said first and second analog signals are input to said first and second input terminals through said low-pass filter, respectively.

9. The A/D converter according to claim 1, wherein
    the A/D converter is formed on one chip together with another digital circuit, and
    said first and second timings are set so as to be shifted from timing of level transition of a clock signal defining operation timing of said digital circuit.

10. An A/D converter comprising an integration circuit or a sample hold circuit including a switched capacitor circuit to which an analog signal is input, wherein
  said switched capacitor circuit includes:
  a sampling capacitor;
  a first switch connected between an input terminal to which said analog signal is input and one end of said sampling capacitor and is turned on at a first timing; and
  a second switch connected between said one end of said sampling capacitor and a reference supply and is turned on at a second timing, and wherein
  said A/D converter further comprises:
  a noise cancel circuit for supplying a signal to cancel a kickback noise generated in said input terminal when said first switch is turned on to said input terminal at said first timing,
  the A/D converter further including a low-pass filter in a previous stage of said switched capacitor, wherein
  said analog signal is input to said input terminal through said low-pass filter.

11. An A/D converter comprising an integration circuit or a sample hold circuit including a switched capacitor circuit to which an analog signal is input, wherein
  said switched capacitor circuit includes:
  a sampling capacitor;
  a first switch connected between an input terminal to which said analog signal is input and one end of said sampling capacitor and is turned on at a first timing; and
  a second switch connected between said one end of said sampling capacitor and a reference supply and is turned on at a second timing,
  wherein said A/D converter further comprises:
  a noise cancel circuit for supplying a signal to cancel a kickback noise generated in said input terminal when said first switch is turned on to said input terminal at said first timing, and
  wherein the A/D converter is formed on one chip together with another digital circuit, and
  said first and second timings are set so as to be shifted from timing of level transition of a clock signal defining operation timing of said digital circuit.

12. A semiconductor device, wherein
  an A/D converter for converting an analog signal to a digital signal;
  a driver circuit provided in a previous stage of said A/D converter relative to said analog signal to be input, for transmitting said analog signal to said A/D converter; and
  a microcomputer for receiving said digital signal generated by said A/D converter are formed on one chip, and wherein
  said A/D converter comprises in an input first-stage section for receiving the signal from said driver circuit;
  a switched capacitor circuit for switching connection of each switch depending on a clock signal defining a sampling cycle; and
  a charge cancel circuit having a plurality of switches, for generating a kickback of which polarity is opposite from the polarity of the kickback by said switched capacitor circuit by changing the connection of each switch depending on said clock signal.

13. The semiconductor device according to claim 12, wherein
  said A/D converter includes ΔΣ modulation circuit, and
  said charge cancel circuit is connected between said switched capacitor circuit of a first-stage integrator of said ΔΣ modulation circuit and a driver circuit.

14. The semiconductor device according to claim 12, wherein said A/D converter includes a sample hold circuit, and
  said charge cancel circuit is connected between said switched capacitor circuit of said sample hold circuit and a driver circuit.

* * * * *